(12) United States Patent
Hua et al.

(10) Patent No.: US 8,404,583 B2
(45) Date of Patent: Mar. 26, 2013

(54) CONFORMALITY OF OXIDE LAYERS ALONG SIDEWALLS OF DEEP VIAS

(75) Inventors: Zhong Qiang Hua, Saratoga, CA (US); Manuel A. Hernandez, Santa Clara, CA (US); Lei Luo, San Jose, CA (US); Kedar Sapre, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/035,034

(22) Filed: Feb. 25, 2011

(65) Prior Publication Data

US 2011/0223760 A1  Sep. 15, 2011

Related U.S. Application Data

(60) Provisional application No. 61/313,393, filed on Mar. 12, 2010.

(51) Int. Cl.
*H01L 21/44* (2006.01)
*H01L 21/31* (2006.01)
*H01L 21/469* (2006.01)

(52) U.S. Cl. ........ 438/653; 438/248; 438/391; 438/787; 257/E21.584

(58) Field of Classification Search .......... 438/653, 438/248, 391, 668, 680, 770, 778, 787–790; 257/E21.584

See application file for complete search history.

(56) References Cited

U.S. PATENT DOCUMENTS

| | | | |
|---|---|---|---|
| 4,666,556 A | 5/1987 | Fulton et al. | |
| 6,020,091 A * | 2/2000 | Lee | 430/5 |
| 6,149,974 A | 11/2000 | Nguyen et al. | |
| 6,177,698 B1 * | 1/2001 | Gruening et al. | 257/302 |
| 6,319,324 B1 | 11/2001 | Nguyen et al. | |
| 6,733,955 B1 | 5/2004 | Geiger et al. | |
| 6,753,270 B1 | 6/2004 | Geiger et al. | |
| 6,875,558 B1 | 4/2005 | Gaillard et al. | |
| 7,176,105 B2 | 2/2007 | Nemani et al. | |
| 7,741,188 B2 * | 6/2010 | Dyer et al. | 438/386 |
| 2003/0045124 A1 | 3/2003 | Shih et al. | |
| 2004/0142562 A1 | 7/2004 | Chen et al. | |

(Continued)

FOREIGN PATENT DOCUMENTS

WO   WO 2011/112402 A2   9/2011

OTHER PUBLICATIONS

Huang et al., "Dependence of Film Properties of Subatmospheric Pressure Chemical Vapor Deposited Oxide on Ozone-to-Tetraethylorthosilicate Ratio", J. Electrochem. Soc. 1993, vol. 140, iss. 6, pp. 1682-1686.*

(Continued)

*Primary Examiner* — Leonard Chang
(74) *Attorney, Agent, or Firm* — Kilpatrick Townsend & Stockton LLP

(57) ABSTRACT

A method for improving conformality of oxide layers along sidewalls of vias in semiconductor substrates includes forming a nitride layer over an upper surface of a semiconductor substrate and forming a via extending through the nitride layer and into the semiconductor substrate. The via may have a depth of at least about 50 μm from a top surface of the nitride layer and an opening of less than about 10 μm at the top surface of the nitride layer. The method also includes forming an oxide layer over the nitride layer and along sidewalls and bottom of the via. The oxide layer may be formed using a thermal chemical vapor deposition (CVD) process at a temperature of less than about 450° C., where a thickness of the oxide layer at the bottom of the via is at least about 50% of a thickness of the oxide layer at the top surface of the nitride layer.

10 Claims, 8 Drawing Sheets

U.S. PATENT DOCUMENTS

2004/0180509 A1* 9/2004 Wang et al. .................. 438/424
2008/0166888 A1* 7/2008 Hsu et al. ..................... 438/787
2009/0127648 A1* 5/2009 Chen et al. ................... 257/506
2009/0278238 A1* 11/2009 Bonifield et al. ............ 257/621

OTHER PUBLICATIONS

Bhatnagar, A., et al. "Highly Conformal Oxide Liner Technology for High Aspect Ratio TSVs", Nanochip Technology Journal, 2010, pp. 1-5, Issue One.

International Search Report and Written Opinion for PCT Patent Application No. PCT/US2001/026834, mailed on Nov. 1, 2011, 9 pages.

Sleeckx, Erik et al., "A Conformal Oxide Liner for Through Silicon Vias by Pulsed SA-CVD Deposition", $216^{th}$ ECS Meeting, Vienna, Austria, Oct. 4-9, 2009, vol. 25, Issue 8, pp. 659-666.

\* cited by examiner

CONFORMALITY OF OXIDE LAYERS ALONG SIDEWALLS OF DEEP VIAS

CROSS-REFERENCES TO RELATED APPLICATIONS

The present invention claims benefit of priority under 35 U.S.C. §119(e) of U.S. Provisional Application No. 61/313,393, filed Mar. 12, 2010, the content of which is incorporated herein by reference in its entirety for all purposes.

BACKGROUND

The present invention relates generally to semiconductor processing. More particularly, the present invention relates to methods of improving conformality of oxide layers along sidewalls of deep vias in semiconductor substrates. Embodiments of the present invention may be used, for example, to form via liners with high conformality in deep and/or high aspect ratio vias.

One of the primary steps in fabricating modern semiconductor devices is forming a dielectric layer on a semiconductor substrate. As is well known in the art, such a dielectric layer can be deposited by chemical vapor deposition (CVD). In a conventional thermal CVD process, reactive gases are supplied to the substrate surface where heat-induced chemical reactions take place to produce a desired film. In a conventional plasma enhanced CVD (PECVD) process, a controlled plasma is formed to decompose and/or energize reactive species to produce the desired film. In general, reaction rates in thermal CVD and PECVD processes may be controlled using temperature, pressure, and/or reactant gas flow rates.

Increasingly stringent requirements for fabricating dielectric films are needed in order to produce high quality devices. Many next-generation devices use vertical or three-dimensional (3D) integration to increase device density. One challenge in vertical or 3D integration of semiconductor devices is forming conformal oxide layers along sidewalls of deep vias. These vias extend through semiconductor substrates and may have depths of 50 µm or more and openings (or critical dimensions) of 10 µm or less. The vias are subsequently filled with conductive material to provide electrical interconnects. The oxide layers provide electrical isolation between the interconnects and the semiconductor substrate. Electrical performance (e.g., dielectric breakdown, leakage, and the like) is important. A thickness of between 2000 Å to 10,000 Å along the sidewalls of the vias may be required to meet electrical requirements. Thickness uniformity is also important, both for electrical performance as well as impact on subsequent processes. For example, barrier layer and metal seed deposition processes used to form the conductive material in the vias are inherently line-of-sight processes. These processes are unable to form uniform coatings on re-entrant structures. To provide margin for the barrier layer and metal seed deposition processes, oxide layer conformality of at least 50% is generally desired.

Conventional thermal CVD and PECVD processes form dielectric layers that are thicker on horizontal or top surfaces and thinner along sidewalls and bottoms of structures such as vias. This is due at least in part to flux of reactant species during the deposition process. More reactant species reach the top surfaces than the sidewalls and bottoms of the vias. Further, a difference in deposition rate between the top surface and the sidewalls and bottoms increases with thickness of the deposited layer. This is because thickness of the deposited layer on the top surface increases at a faster rate than thickness along the bottom, increasing an aspect ratio (e.g., ratio of depth vs. width) of the via. Also, as the thickness along the top surface increases, an opening (or critical dimension) at the top of the via decreases. High aspect ratios and small critical dimensions decrease conformality (or increase non-uniformity) of deposited layers. This can lead to vias having re-entrant profiles that are difficult to fill with conductive interconnect material.

Thus, there is a need in the art for improved methods of forming conformal dielectric layers along sidewalls of vias. These and other needs are addressed throughout the present application.

SUMMARY

Some embodiments of the present invention provide methods for improving conformality of oxide layers along sidewalls of deep vias that may be used, for example, in vertical or 3D integration. In accordance with an embodiment, for example, a method includes forming a nitride layer over an upper surface of a semiconductor substrate and forming a via extending through the nitride layer and into the semiconductor substrate. The via may have a depth of at least about 50 µm from a top surface of the nitride layer and an opening of less than about 10 µm at the top surface of the nitride layer. The method also includes forming an oxide layer over the nitride layer and along sidewalls and bottom of the via. The oxide layer may be formed using a thermal CVD process at a temperature of less than about 450° C. A thickness of the oxide layer at the bottom of the via may be at least about 50% of a thickness of the oxide layer at the top surface of the nitride layer.

In accordance with another embodiment, a method for improving conformality of oxide layers along sidewalls of vias in semiconductor substrates includes forming a dielectric layer over an upper surface of a substrate and forming a via extending through the dielectric layer and into the substrate. The via may have a depth of at least about 50 µm from a top surface of the dielectric layer and an aspect ratio of at least about 5:1. The method also includes forming an oxide layer over the dielectric layer and along sidewalls and bottom of the via. The oxide layer may be formed using a thermal CVD process at a temperature of less than about 450° C. A deposition rate of the oxide layer on the dielectric layer may be no more than about 85% of a highest deposition rate of the oxide layer along the sidewalls of the via.

DETAILED DESCRIPTION

Embodiments of the present invention provide methods for improving conformality of oxide layers or liners along sidewalls of deep vias. The methods include forming a dielectric layer over a top surface of a substrate and forming vias extending through the dielectric layer and into the substrate. The methods also include forming an oxide layer using a thermal CVD process over the dielectric layer and along sidewalls of the vias. The dielectric layer is selected such that a deposition rate of the oxide layer on the dielectric is less than a deposition rate of the oxide layer on a top surface of the substrate without the dielectric. By reducing the deposition rate of the oxide layer on the top surface, changes in aspect ratio and opening (or critical dimension) of the vias during the deposition process are reduced. This improves conformality of the oxide layer on the sidewalls of the vias. The improved conformality improves electrical performance and provides a via profile that enables improved fill with conductive interconnect material.

Exemplary Process Chamber

Figure 1A:
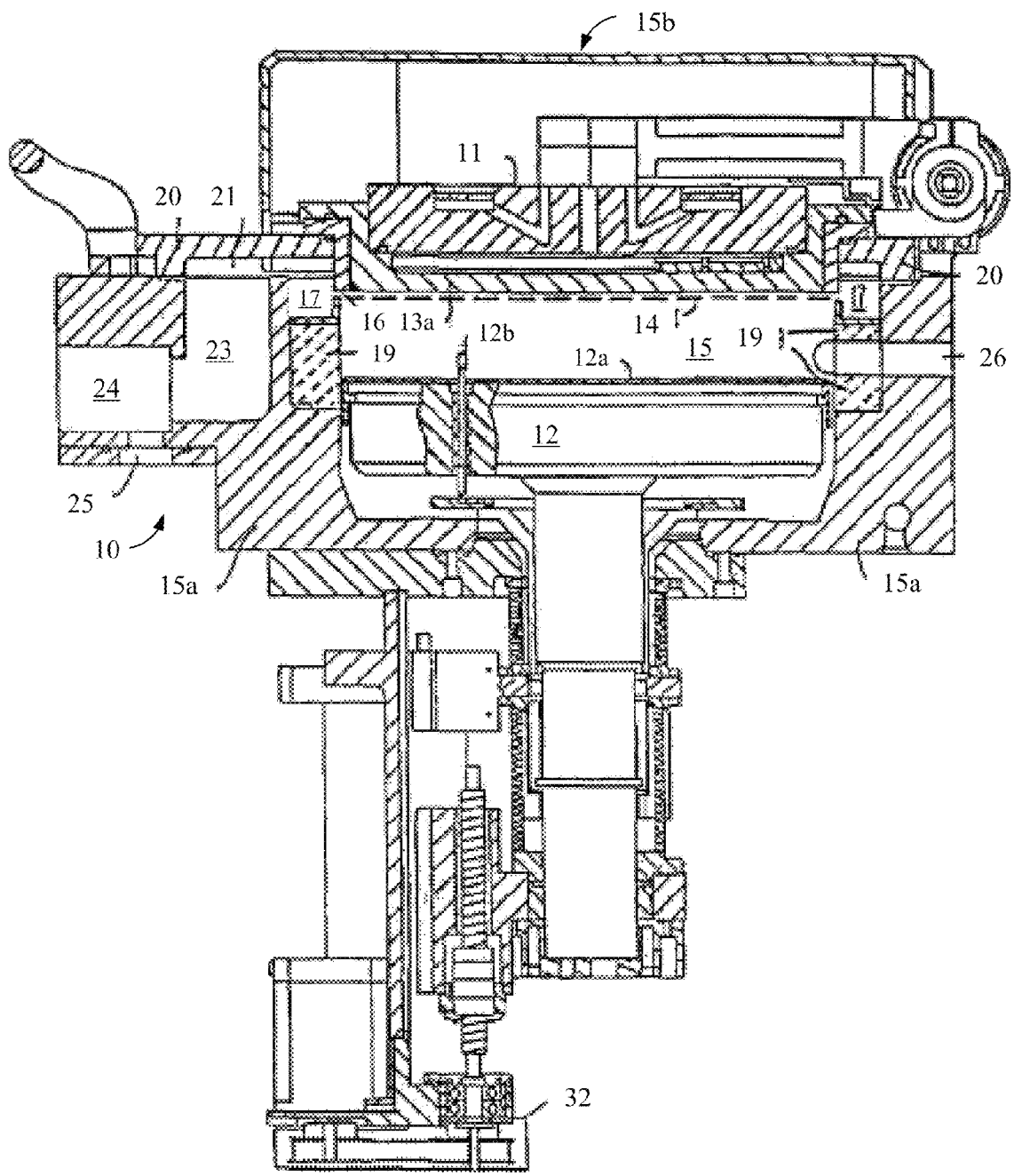
FIGS. 1A-1B are cross-sectional views of an exemplary CVD apparatus that may be used to form oxide layers along sidewalls of vias using thermal CVD processes.
Figure 1B:
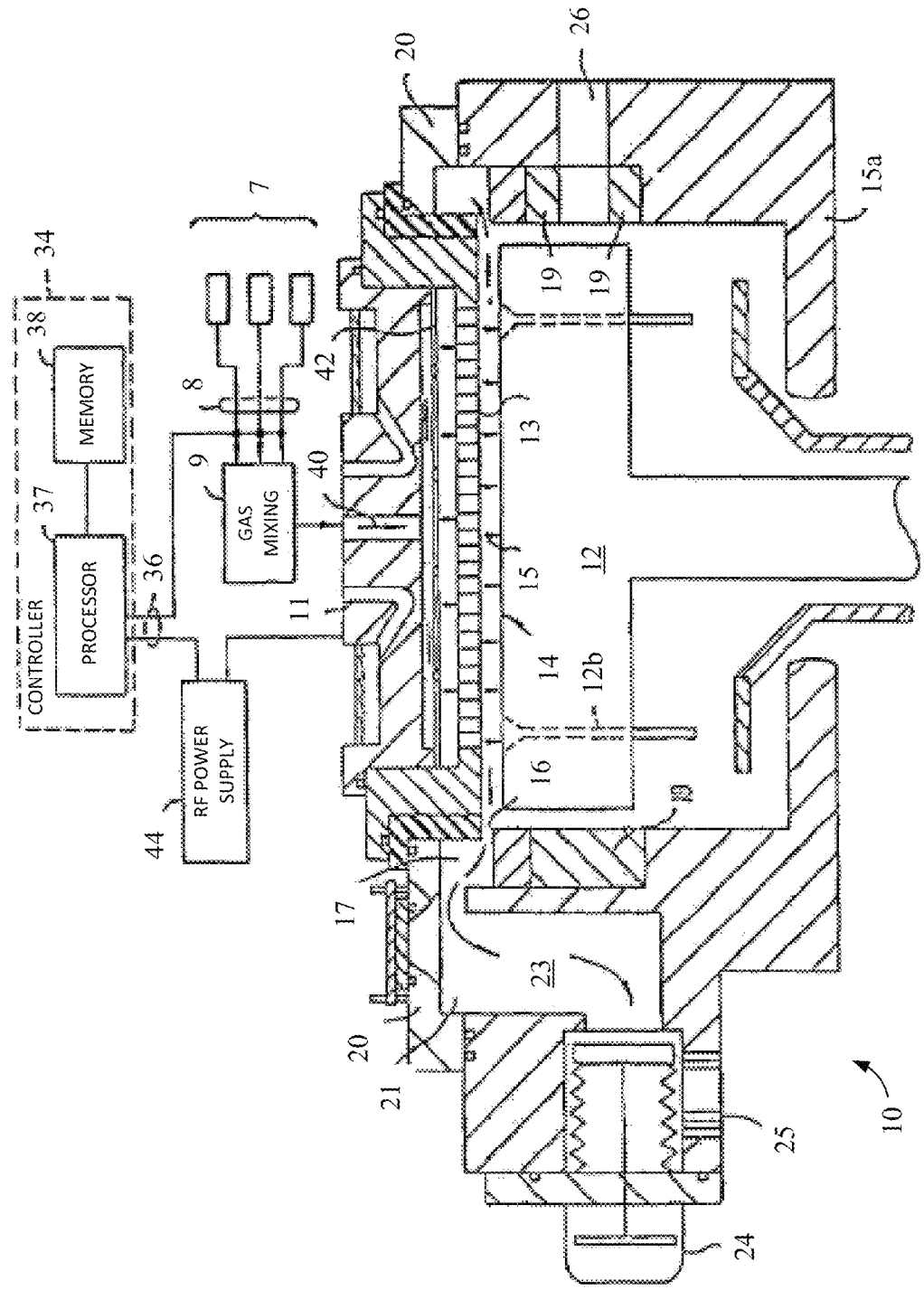

FIGS. 1A-1B are cross-sectional views of an exemplary CVD apparatus that may be used to form oxide layers along sidewalls of vias using thermal CVD processes. FIG. 1A shows a cross-sectional view of a CVD system 10 having a processing chamber 15 that includes a chamber wall 15a and chamber lid assembly 15b. CVD system 10 contains a gas distribution manifold 11 for dispersing process gases to a substrate (not shown) that rests on a heated pedestal or substrate support 12 centered within the process chamber. During processing, the substrate (e.g. a semiconductor wafer) is positioned on a surface 12a of pedestal 12. The pedestal can be moved controllably between a lower loading position (depicted in FIG. 1A) and an upper processing position (indicated by dashed line 14 in FIG. 1A and shown in FIG. 1B).

Deposition and carrier gases are introduced into chamber 15 through perforated holes of a gas distribution member or faceplate. More specifically, deposition process gases flow into the chamber through the inlet manifold 11 (indicated by arrow 40 in FIG. 1B), through a conventional perforated blocker plate 42, and through holes in the gas distribution faceplate.

Before reaching the manifold, deposition and carrier gases are input from gas sources 7 through gas supply lines 8 (FIG. 1B) into a mixing system 9 where they are combined and then sent to manifold 11.

The deposition process performed in CVD system 10 may be a plasma-enhanced process. In a plasma-enhanced process, an RF power supply 44 may apply electrical power between the gas distribution faceplate and the pedestal so as to excite the process gas mixture to form a plasma within the cylindrical region between the faceplate and the pedestal. Constituents of the plasma react to deposit a desired film on the surface of the substrate supported on pedestal 12.

CVD system 10 may also be used for thermal deposition processes. In a thermal process, RF power supply 44 would not be utilized, and the process gas mixture would thermally react to deposit the desired films on the surface of the substrate supported on pedestal 12. The support pedestal 12 may be resistively heated to provide thermal energy for the reaction.

The reactant gases that are not deposited in the chamber, including reaction by-products, are evacuated from the chamber by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side-wall 15a (including the upper dielectric lining 19 on the wall) and the bottom of the circular chamber lid 20. The 360° circular symmetry and uniformity of the slot orifice 16 and the plenum 17 help achieve a uniform flow of process gases over the wafer so as to deposit a uniform film on the wafer.

From the exhaust plenum 17, the gases flow underneath a lateral extension portion 21 of the exhaust plenum 17, through a downward-extending gas passage 23, past a vacuum shut-off valve 24, and into the exhaust outlet 25 that connects to the external vacuum pump (not shown) through a foreline (also not shown).

The pedestal 12 (preferably aluminum, ceramic, or a combination thereof) may be resistively heated. The wiring to the heater element passes through the stem of the pedestal 12. Typically, any or all of the chamber lining, gas inlet manifold faceplate, and various other reactor hardware are made out of material such as aluminum, anodized aluminum, or ceramic.

A lift mechanism and motor 32 (FIG. 1A) raises and lowers the heater pedestal assembly 12 and its wafer lift pins 12b as wafers are transferred into and out of the body of the chamber by a robot blade through an opening 26 in a side of the chamber 15. The motor, valves, flow controllers, gas delivery system, throttle valve, RF power supply, chamber, substrate heating system, and heat exchangers are all controlled by a system controller 34 (FIG. 1B) over control lines 36. Controller 34 relies on feedback from sensors to determine the position of movable mechanical assemblies such as the throttle valve and susceptor which are moved by appropriate motors under the control of controller 34.

In some embodiments, the system controller includes a hard disk drive (memory 38), a floppy disk drive, and a processor 37. The processor may include a single-board computer (SBC), analog and digital input/output boards, interface boards, and stepper motor controller boards.

System controller 34 may control all of the activities of the CVD apparatus. The system controller 34 executes system control software stored as a computer program on a computer-readable medium such as memory 38. Memory 38 may be a hard disk drive or other kind of memory. The computer program includes sets of instructions that dictate the timing, mixture of gases, chamber pressure, chamber temperature, RF power levels, susceptor position, and other parameters of a particular process. Other computer programs stored on other memory devices may also be used to operate controller 34.

The exemplary CVD apparatus shown in FIGS. 1A-1B may be used to form oxide layers along sidewalls of vias using thermal CVD processes. The thermal CVD oxide layers may be formed using a mixture of gases that include a silicon precursor (e.g., silane ($SiH_4$), tetraethylorthosilicate (TEOS), octamethylcyclotetrasiloxane (OMCTS), etc.), an oxygen source (e.g., $O_2$, ozone, etc.), and optionally a carrier gas (e.g., Ar, He, and/or $N_2$, etc.). In an exemplary embodiment, the thermal CVD process is a sub-atmospheric CVD (SACVD) process using process gases that comprise TEOS, ozone, and $N_2$. In an embodiment, the TEOS flow may be in the range of about 1.5 gm to about 3.5 gm, the ozone flow may be in the range of about 11000 sccm to about 16000 sccm, and the $N_2$ flow may be in the range of about 25000 sccm to about 29000 sccm. The temperature during the thermal CVD process may be in the range of about 350° C. to about 550° C.

Experimental Results and Measurements

In accordance with an embodiment of the invention, conformality of thermal CVD oxide layers formed along sidewalls of vias can be improved by depositing the oxide layers over a structure that includes a dielectric layer on a top surface. The dielectric layer is selected to reduce a deposition rate of the oxide layer at the top surface. This results in a thinner oxide layer on the top surface thus reducing an increase in aspect ratio during the deposition process. Also, since the deposition rate on the top surface is reduced, an overhang caused by lateral growth of the oxide film at openings of the vias is also reduced. This effectively increases the openings of the vias. By reducing the aspect ratios and increasing the openings, conformality is improved. Examples are provided below showing that dielectric layers comprising silicon nitride and phosphosilicate glass (PSG) can be used to reduce a deposition rate of a thermal CVD oxide layer on a top surface of a structure, thus improving conformality along the sidewalls of the vias. Other dielectric layers that reduce the deposition rate may also be used in accordance with embodiments of the invention.

Figure 2:
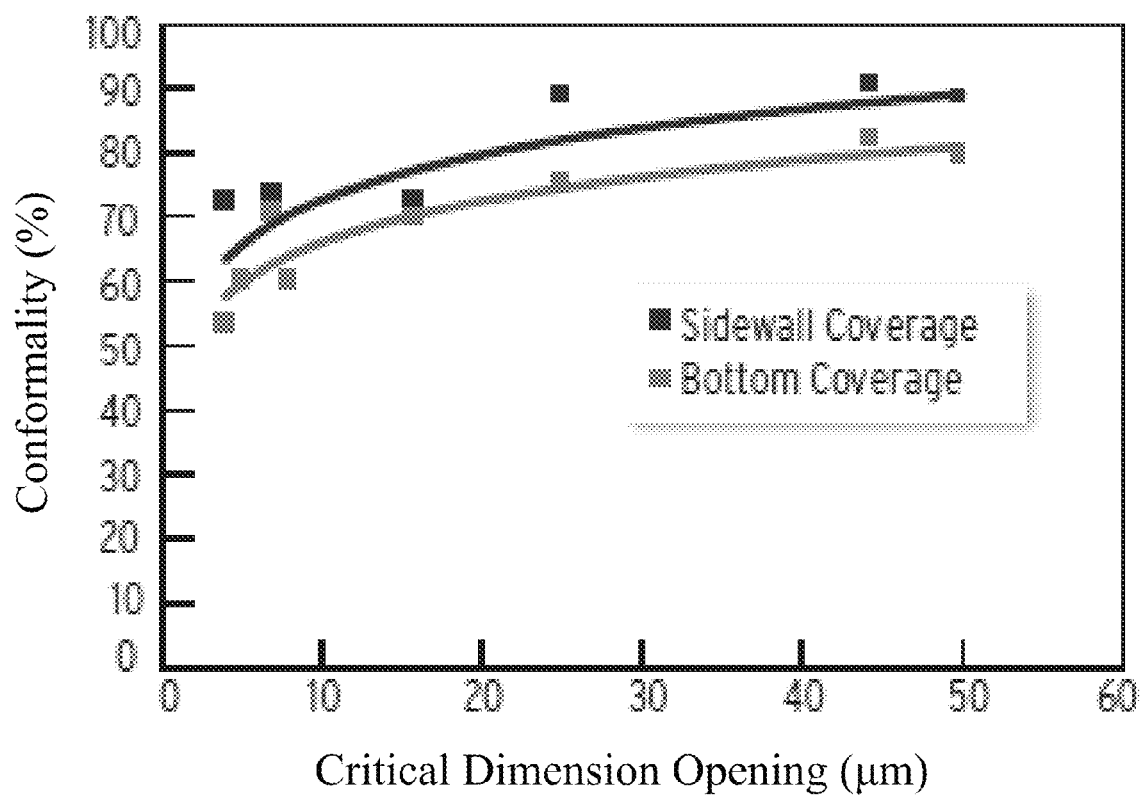
FIG. 2 is a plot of thickness versus time and nitride to silicon sensitivity versus time for thermal CVD oxide layers formed on nitride and silicon surfaces.

FIG. 2 is a plot of opening (or critical dimension) versus conformality for deep vias having openings in a range of between <5 μm to as much as 50 μm. The opening is measured at a top surface of the via. The sidewall coverage (or conformality) is determined using a thickness of the oxide layer near a midpoint of the via and a thickness of the oxide layer at a top surface. The bottom coverage (or conformality) is determined using a thickness of the oxide layer at a bottom of the via and a thickness of the oxide layer at a top surface. Generally the bottom portion of the oxide layer is removed prior to filling the via with conductive material. This plot shows a sharp decrease in conformality for vias having openings of about 10 μm or less. This illustrates the benefit of reducing deposition rate of the oxide layer at the top surface so as to limit lateral growth that reduces openings of the vias.

Similar to the data shown in FIG. 2, oxide layer conformality along sidewalls of vias is also dependent on aspect ratios of the vias. As the aspect ratios increase, the conformality decreases. Thus, by reducing deposition rate (and thickness) of the oxide layer at the top surface, changes in aspect ratio caused by increased thickness of the oxide layer at the top surface are reduced and conformality along the sidewalls of the vias is improved.

Figure 3:
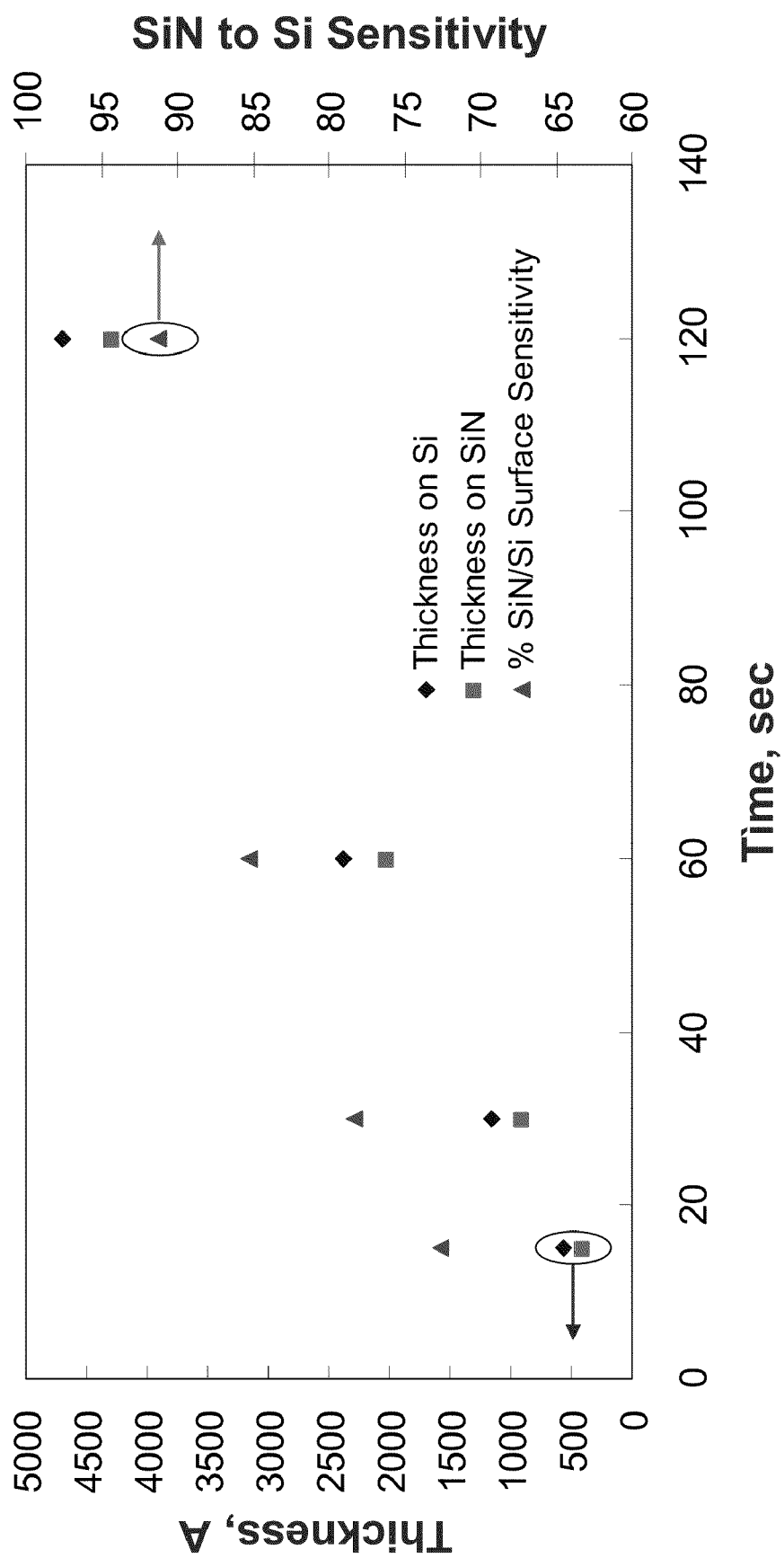
FIG. 3 is a chart comparing thickness of thermal CVD oxide layers and PECVD oxide layers formed on nitride and silicon surfaces.

FIG. 3 is a plot of thickness versus time and nitride to silicon sensitivity versus time for thermal CVD oxide layers formed on nitride and silicon surfaces. The plot shows that thermal CVD oxide thickness (or deposition rate) is greater on a silicon surface than on a nitride surface. Also, a difference between the thermal CVD oxide thickness on silicon and the thermal CVD oxide thickness on nitride increases with deposition time (or thickness), suggesting a difference in the deposition process and not merely a difference in a nucleation or initiation phase of the process.

Figure 4:
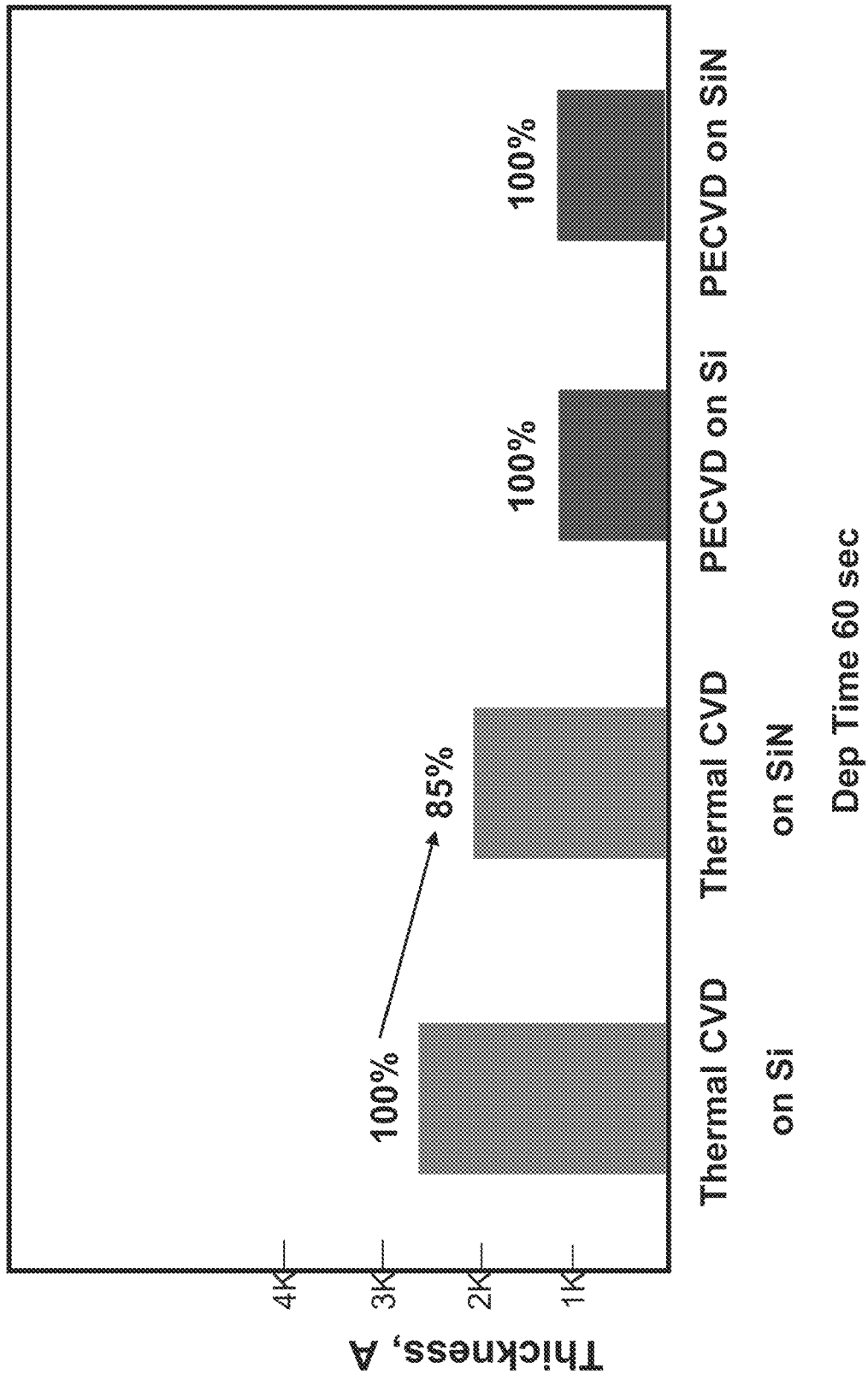
FIG. 4 is a plot of opening (or critical dimension) versus conformality for deep vias having openings in a range of between <5 µm to as much as 50 µm.

FIG. 4 is a chart comparing thickness of thermal CVD oxide layers and PECVD oxide layers formed on nitride and silicon surfaces. FIG. 4 shows that thermal CVD oxide thickness (or deposition rate) is greater on a silicon surface than on a nitride surface. The oxide thickness (or deposition rate) on the nitride surface is about 85% of that on the silicon surface. The chart also shows that PECVD oxide thickness (or deposition rate) does not show a sensitivity between nitride and silicon surfaces. Thus, oxide layers formed using PECVD processes would not benefit from a reduced deposition rate in the same manner as thermal CVD processes.

Figure 5:
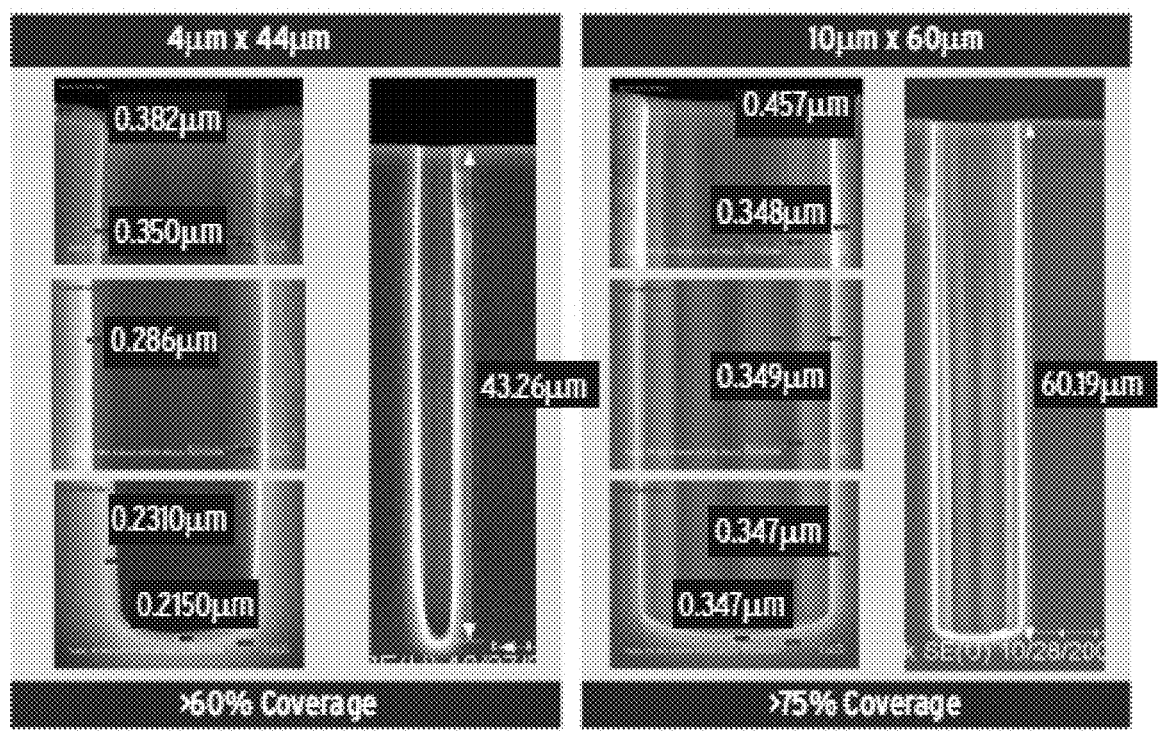
FIG. 5 shows cross-sectional images of conformal thermal CVD oxide layers extending over nitride layers and along sidewalls of deep vias in accordance with an embodiment of the invention.

FIG. 5 shows cross-sectional images of conformal thermal CVD oxide layers extending over nitride layers and along sidewalls of deep vias in accordance with an embodiment of the invention. The vias may be part of a vertical or 3D device. The cross-sectional images on the left show that oxide layers with greater than 60% conformality can be formed along sidewalls of vias having a depth of 44 μm and an aspect ratio of 11:1 when deposited over a nitride layer on the surface. The cross-sectional images on the right show that oxide layers with greater than 75% conformality can be formed along sidewalls of vias having a depth of 60 μm and an aspect ratio of 6:1 when deposited over a nitride layer on the surface. In this example, conformality is determined from a ratio of oxide thickness near a bottom of the via and oxide thickness over a top surface of the nitride layer.

Figure 6:
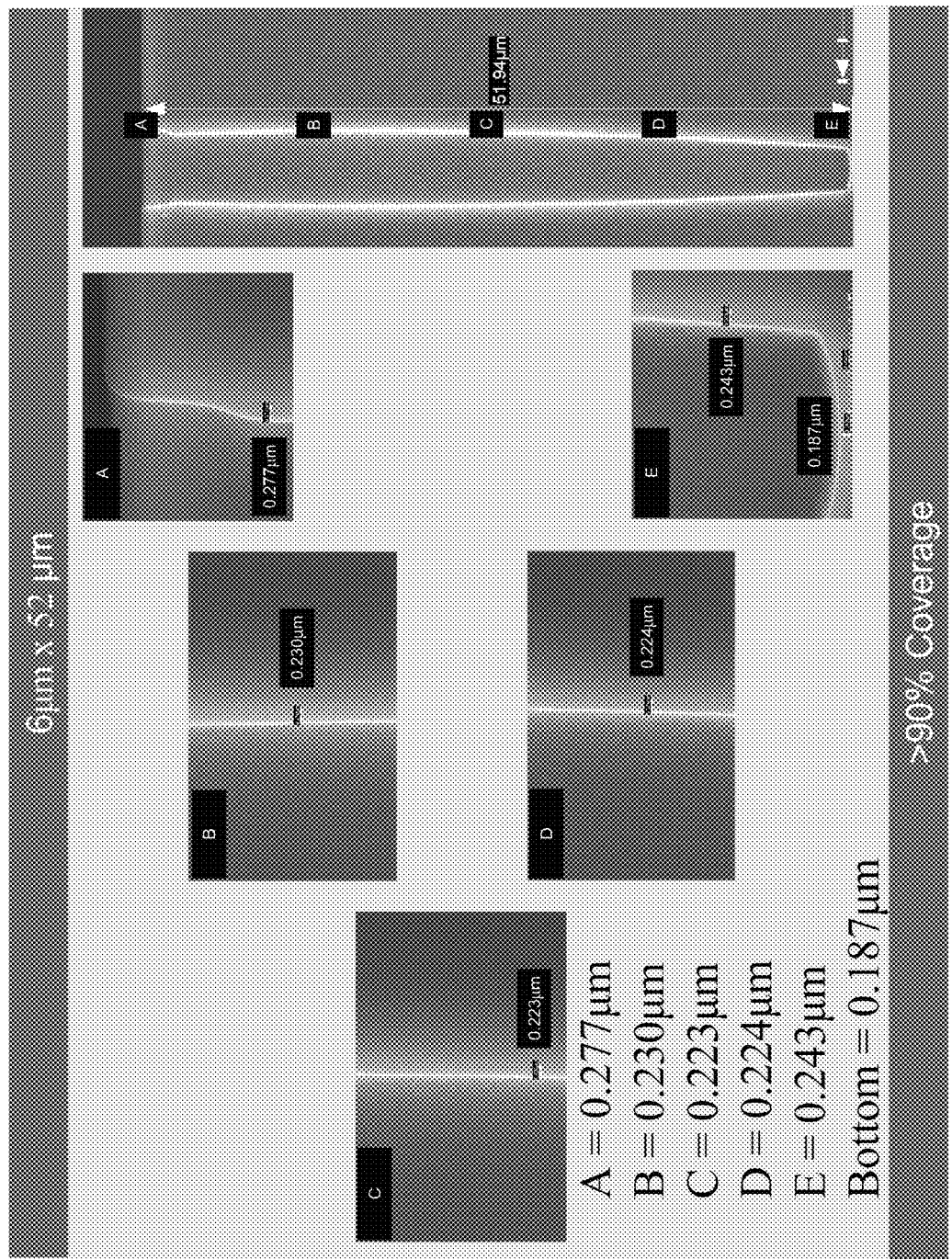
FIG. 6 shows cross-sectional images of a conformal thermal CVD oxide layer extending over a phosphosilicate glass (PSG) layer and along sidewalls of a deep via in accordance with an embodiment of the invention.

FIG. 6 shows cross-sectional images of a conformal thermal CVD oxide layer extending over a PSG layer and along sidewalls of a deep via in accordance with an embodiment of the invention. Like FIG. 5, the via may be part of a vertical or 3D device. The cross-sectional images show that an oxide layer with greater than 90% conformality can be formed along sidewalls of vias having a depth of 52 μm and an aspect ratio of almost 9:1 when deposited over a PSG layer on the surface. Like FIG. 5, conformality in this example is determined from a ratio of oxide thickness near a bottom of the via and oxide thickness near a top of the via.

Exemplary Methods

Figure 7:
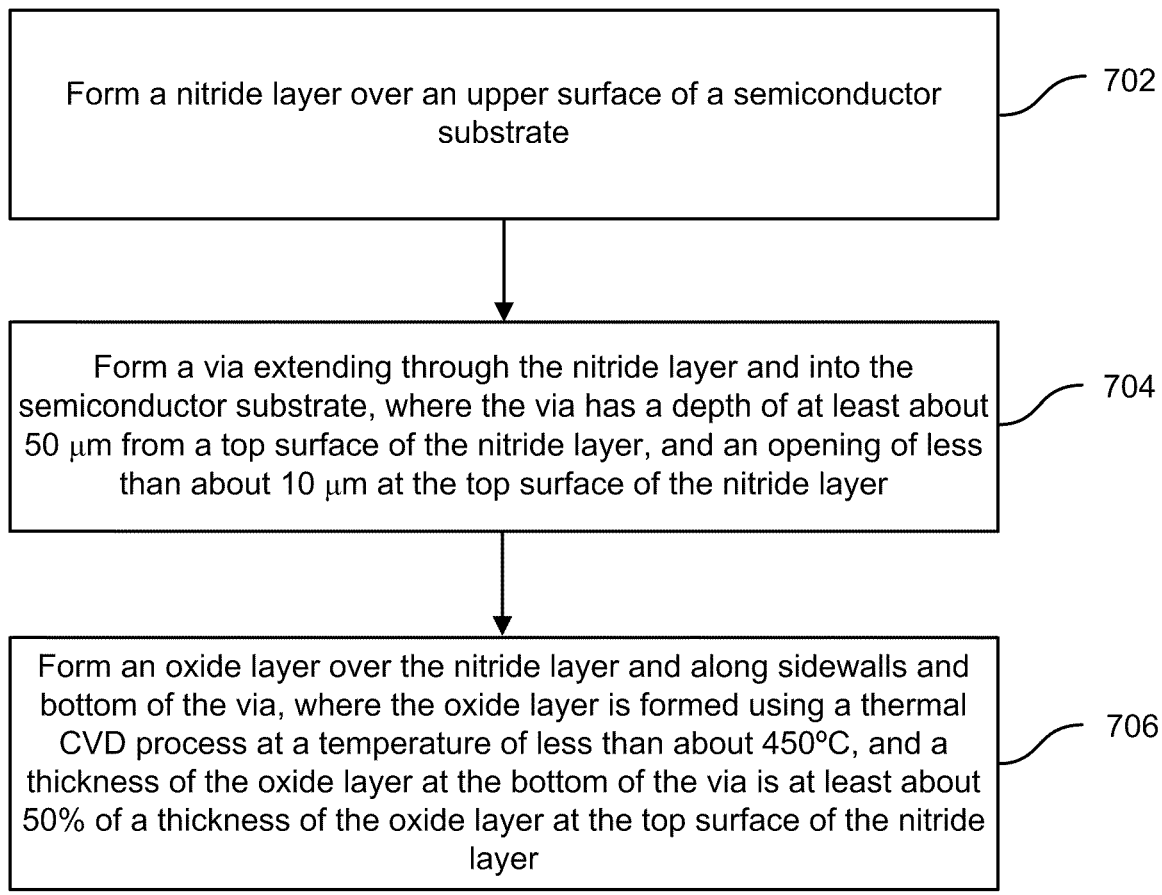
FIG. 7 is a simplified flow chart illustrating an exemplary method of improving conformality of oxide layers along sidewalls of vias in accordance with an embodiment of the invention.

FIG. 7 is a simplified flow chart illustrating an exemplary method of improving conformality of oxide layers along sidewalls of vias in accordance with an embodiment of the invention. The method includes forming a nitride layer over an upper surface of a semiconductor substrate (702). As discussed previously, other dielectric layers such as PSG layer may also be formed on the upper surface of the semiconductor substrate. The dielectric layer is selected such that a deposition rate of thermal CVD oxide on the dielectric layer is less than a deposition rate of the thermal CVD oxide on the upper surface of the semiconductor substrate without the dielectric layer.

The method also includes forming a via extending through the nitride layer and into the semiconductor substrate, where the via has a depth of at least about 50 μm from a top surface of the nitride layer and an opening of less than about 10 μm at the top surface of the nitride layer (704). As discussed above with regard FIG. 2, conformality decreases sharply for deep vias having openings of about 10 μm or less. Conformality also decreases for deep (e.g., about 50 μm or more) vias.

The method also includes forming an oxide layer over the nitride layer and along sidewalls and bottom of the via, where the oxide is layer formed using a thermal CVD process at a temperature of less than about 450° C., and a thickness of the oxide layer at the bottom of the via is at least about 50% of a thickness of the oxide layer at the top surface of the nitride layer (706). One method that has been used to improve conformality is to increase deposition temperature. With vertical or 3D devices, however, deposition temperature is limited to less than about 450° C. to prevent damage to the device. Conformality of thermal CVD oxide layers formed at these temperatures is typically poor, causing increases in aspect ratios and decreases in openings. Consequently, improvements in conformality provided by embodiments of the invention are more significant as thermal CVD deposition temperature decreases. Conformality greater than about 50% is desired to provide margin for the barrier layer and metal seed depositions.

While the present invention has been described in terms of specific embodiments, it should be apparent to those skilled in the art that the scope of the invention is not limited to the embodiments described herein. For example, it is to be understood that the features of one or more embodiments of this invention may be combined with one or more features of other embodiments of the invention without departing from the scope of the invention. Also, the examples and embodiments described herein are for illustrative purposes only, and various modifications or changes in light thereof will be evident to persons skilled in the art and are to be included within the spirit and purview of this application and the scope of the appended claims.

What is claimed is:

1. A method for improving conformality of oxide layers along sidewalls of vias in semiconductor substrates, the method comprising:
    forming a nitride layer over an upper surface of a semiconductor substrate;
    forming a via extending through the nitride layer and into the semiconductor substrate, the via having a depth of at least about 45 µm from a top surface of the nitride layer, and an opening of less than about 4.5 µm at the top surface of the nitride layer; and
    forming an oxide liner over the nitride layer and along sidewalls and bottom of the via, the oxide layer formed using a thermal chemical vapor deposition (CVD) process at a temperature of less than about 450° C., wherein a thickness of the oxide liner at the bottom of the via is at least about 50% of a thickness of the oxide liner at a top of the via.

2. The method of claim 1 wherein the oxide liner is formed using a process gas that comprises organosilicon and ozone.

3. The method of claim 1 wherein the sidewalls and the bottom of the via comprise silicon.

4. The method of claim 1 further comprising:
    forming a metal barrier layer over the oxide liner along sidewalls of the via; and
    filling the via with a metal layer.

5. The method of claim 1 wherein the semiconductor substrate is a silicon substrate.

6. The method of claim 1 wherein the thermal CVD process uses a sub-atmospheric pressure.

7. A method for improving conformality of oxide layers along sidewalls of vias in semiconductor substrates, the method comprising:
    forming a nitride layer over an upper surface of a substrate;
    forming a via extending through the nitride layer and into the substrate, the via having a depth of at least about 50 µm from a top surface of the nitride layer, and an aspect ratio of at least about 5:1; and
    forming an oxide liner over the nitride layer and along sidewalls and bottom of the via, the liner formed using a thermal chemical vapor deposition (CVD) process at a temperature of less than about 450° C., wherein a thickness of the oxide liner at the bottom of the via is at least about 50% of a thickness of the liner at a top of the via.

8. The method of claim 7 wherein the oxide layer is formed using a process gas that comprises organosilicon and ozone.

9. The method of claim 7 further comprising:
    forming a metal barrier layer over the oxide liner along sidewalls of the via; and
    filling the via with a metal layer.

10. The method of claim 7 wherein the substrate is a silicon substrate.

* * * * *